US006783875B2

(12) United States Patent
Yamada et al.

(10) Patent No.: US 6,783,875 B2
(45) Date of Patent: Aug. 31, 2004

(54) HALOGEN GAS PLASMA-RESISTIVE MEMBERS AND METHOD FOR PRODUCING THE SAME, LAMINATES, AND CORROSION-RESISTANT MEMBERS

(75) Inventors: Hirotake Yamada, Nagoya (JP); Yuji Katsuda, Nagoya (JP); Tsuneaki Ohashi, Nagoya (JP); Masaaki Masuda, Nagoya (JP); Masashi Harada, Nagoya (JP); Hiroyuki Iwasaki, Nagoya (JP); Shigenori Ito, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/835,857

(22) Filed: Apr. 16, 2001

(65) Prior Publication Data

US 2002/0018921 A1 Feb. 14, 2002

(30) Foreign Application Priority Data

| Apr. 18, 2000 | (JP) | ................................. 2000-116484 |
| Apr. 21, 2000 | (JP) | ................................. 2000-121112 |
| Dec. 11, 2000 | (JP) | ................................. 2000-376151 |
| Dec. 21, 2000 | (JP) | ................................. 2000-388298 |

(51) Int. Cl.$^7$ .......................... B32B 9/04; B32B 18/00; B05D 1/02
(52) U.S. Cl. .................. 428/697; 428/304.1; 428/332; 428/334; 428/699; 428/701; 428/702; 427/248.1; 427/376.1; 427/427
(58) Field of Search ................................ 428/689, 697, 428/699, 701, 702, 304.1, 332, 334; 427/421, 427, 376.1, 248.1

(56) References Cited

U.S. PATENT DOCUMENTS

| 5,783,907 | A | * | 7/1998 | Suzuki et al. ................ 313/625 |
| 5,798,016 | A | | 8/1998 | Oehrlein et al. |
| 6,071,627 | A | * | 6/2000 | Yasuda et al. ............... 428/610 |
| 6,294,260 | B1 | * | 9/2001 | Subramanian .............. 428/469 |
| 6,383,964 | B1 | * | 5/2002 | Nakahara et al. ........... 501/152 |
| 6,447,937 | B1 | * | 9/2002 | Murakawa et al. ......... 428/696 |
| 2001/0003271 | A1 | | 6/2001 | Otsuki ......................... 118/723 |
| 2002/0177001 | A1 | | 11/2002 | Harada et al. |

FOREIGN PATENT DOCUMENTS

| EP | 0 891 957 A1 | | 1/1999 |
| JP | 352051776 A | * | 4/1977 |
| JP | 05-238855 | | 9/1993 |
| JP | 06-256926 | | 9/1994 |
| JP | 407215798 A | * | 8/1995 |
| JP | 10-045461 | | 2/1998 |
| JP | 2000-159572 | | 6/2000 |
| JP | 2000-164572 | | 6/2000 |
| JP | 2000-191369 | | 7/2000 |
| JP | 2000-247726 | | 9/2000 |
| KR | 2001-62209 A | | 7/2001 |
| WO | WO 99/20812 | | 4/1999 |
| WO | WO 01/00901 A1 | | 1/2001 |
| WO | WO 01/42526 A1 | | 6/2001 |

* cited by examiner

Primary Examiner—Stephen Stein
(74) Attorney, Agent, or Firm—Burr & Brown

(57) ABSTRACT

A halogen gas plasma-resistant member to be exposed to a halogen gas plasma, includes a main body of said member, and a corrosion-resistant film formed at least a surface of said main body, wherein a peeling resistance of the corrosive film to said main body is not less than 15 MPa.

54 Claims, 4 Drawing Sheets

Structure of reacted layer (section)

Surface of 99.9% Y₂O₃ sprayed product (×5000)

Section of 99.9% Y₂O₃ sprayed product (×1000)

Surface of 1600°C×3h Co-sintered product (×5000)

Surface of 1600°C Co-sintered product (×1000)

Surface of 1700°C×3h Co-sintered product (×5000)

Surface of 1700°C Co-sintered product (×1000)

HALOGEN GAS PLASMA-RESISTIVE MEMBERS AND METHOD FOR PRODUCING THE SAME, LAMINATES, AND CORROSION-RESISTANT MEMBERS

BACKGROUND OF THE INVENTION

1. Field of the Invention

The present invention relates to halogen gas plasma-resistive members to be used as chamber walls and roofs in semiconductor-producing apparatuses.

2. Related Art Statement

In the semiconductor-producing apparatuses requiring the super clean state, halogen-based corrosive gases such as chlorine-based gases and fluorine-based gases are used as depositing gases, etching gases and cleaning gases.

For example, a semiconductor-cleaning gas composed of a halogen-based corrosive gas such as $ClF_3$, $NF_3$, $CF_4$, HF or HCl is used in the semiconductor-producing gas such as a hot CVD apparatus. In the depositing stage, the halogen-based corrosive gas such as $WF_6$ or $SiH_2Cl_2$ is used as a film-forming gas.

Further, corrosion gases such as CF-based gases, oxygen, chlorine-based gases, and bromine-based gases are also used in etching apparatuses.

There is recently a tendency that a particularly highly corrosive gas such as $NF_3$ is used to increase the etching speed. Owing to this, there is a problem that wall surfaces of chambers of the semiconductor-producing apparatuses are corroded to form particles, and such particles falls on wafers. Further, it may be that a reaction product deposited on the wall surface is peeled and falls on wafers as particles. This causes poor insulation and poor conduction phenomena, resulting in poor semiconductors. Accordingly, a technique for preventing the transfer of the particles onto the wafers from the wall surfaces of the chambers or roofs has been demanded.

SUMMARY OF THE INVENTION

It is an object the present invention to provide a halogen gas plasma-resistant member to be exposed to halogen gas plasma, which member suppresses the floating in a space inside a container and falling and depositing on other members in the container of particles formed by corrosion of the members and with worked dust of wafers.

Further, there is known a technique that a chamber or a dome is made of a ceramic material such as alumina, and its surface is coated with a corrosion-resistant film. In this case, however, it is indispensably required to prevent occurrence and falling of the above-mentioned particles and to suppress the peeling of the corrosive-resistant film. It is indispensable that the corrosive-resistant film does not peel and firmly adheres to the surfaces of the chamber or the dome even after application of a number of heat cycles particularly under an environment where the corrosive-resistant film contacts with the corrosive material.

A first aspect of the present invention is directed to a halogen gas plasma-resistant member to be exposed to a halogen gas plasma, comprising a main body of said member, and a corrosion-resistant film formed on at least a surface of said main body, wherein a relative density of the corrosion-resistant film is not less than 90%, preferably not less than 95%, and a peeling resistance of the corrosive film to said main body is not less than 15 MPa.

A first aspect of the present invention is also directed to a halogen gas plasma-resistant member to be exposed to a halogen gas plasma, comprising a main body of the member, and a corrosion-resistant film formed on at least a surface of said main body, wherein a relative density of the corrosion-resistant film is not less than 90%, preferably not less than 95%, and a center-line average surface roughness Ra of the corrosion-resistant film is not less than 1.2 μm.

The present inventors discovered that floating in a space inside a container and falling and depositing on other members in the container of particles formed by corrosion are suppressed by forming the corrosive-resistant film having the relative density and the peeling resistance as mentioned above on the surface of the main body of the member. It is probably considered that an increase in the peeling resistance of the film reduces the peeling of the corrosion-resistant film form the main body and thus decreases the particles. The inventors further discovered that the above peeling resistance needs to be substantially not less than 15 MPa so as to prevent the formation of the particles.

Furthermore, the present inventors discovered that floating in the space inside a container and falling and depositing on other members in the container of particles formed by corrosion are suppressed by forming the corrosive-resistant film having the relative density and the Ra as mentioned above on the surface of the main body of the member.

It is considered that the corrosion-resistant film functions to suppress the formation of the particles, and that even if a small amount of particles formed by corrosion and working wafers are maintained on the surface of the corrosion-resistant film, increasing the relative density of the corrosion-resistant film, reducing pores in the surface and increasing the Ra (retaining unevenness at the surface) as mentioned above, thereby avoids the floating in the space and falling and depositing on other members of the particles.

The large surface roughness Ra of the corrosive-resistant film means that uneven portions remain at the surface of the film. When the surface is microscopically viewed, there are recesses and their adjacent projections. The projections are made of particles that project from adjacent recesses. Therefore, it was considered that when the Ra of the surface of the corrosion-resistant film is increased, the halogen gas plasma enters the recesses at the surface, grain boundaries are corroded from root portions of the projections (particles), and thus the formation of the particles is promoted. However, the larger Ra contributes less to the increase in such particles, but on the contrary prevents the floating in the space inside the container and falling of the particles.

From the above standpoint, the center-line average surface roughness of the corrosion-resistant film is preferably not less than 3 μm. Since too large Ra promotes the corrosion of the surface of the corrosion-resistant film and thus increases the particles, Ra is preferably not more than 20 μm from this point of view, more preferably not more than 8 μm. The relative density of the corrosion-resistant film is preferably not more than 95%.

The waveness Wa of the corrosion-resistant film is preferably not less than 1 μm. As a matter of course, there is no such limitation in a case where a byproduct is produced as a gas phase according to some processes, which does not form a solid matter such as particles. In this case, the surface roughness is preferably not more than 1.5 μm, more preferably not more than 1.0 μm. In this case, the relative density of the corrosion-resistant film is preferably not less than 90%, more preferably not less than 95%.

The corrosion-resistant film is preferably free from cracks having lengths of not less than 3 μm and/or widths of not less than 1 μm.

It can be confirmed by a scanning type electron microscope at not less than 5000 times magnification whether the corrosion-resistant film is free from such microcracks or not.

An underlying face for the corrosion-resistant film is preferably porous. The center-line average surface roughness Ra of the underlying face of the corrosion-resistant film is preferably not less than 1.2 μm, and more preferably not less than 1.5 μm. In that case, the adhesion of the corrosion-resistant film to the underlying face can be enhanced, and production of particles due to the peeling of the film can be prevented.

In order to coarsen the underlying face, the underlying face may be made porous or the underlying face may be processed by grain polishing or sand blasting.

It is a second aspect of the present invention to provide a laminate comprising a substrate made of alumina and a film formed on the substrate, in which the film is hard to be peeled from the substrate and the film is hard to be peeled even after the film contacts a corrosive material.

The second aspect of the present invention is also to provide a corrosion-resistant member having high corrosion resistance and long-term stable usability with use of this laminate, particularly a halogen gas plasma-resistive member.

The second aspect of the present invention is directed to a laminate comprising a substrate made of alumina, and a film of a yttrium compound formed on the substrate, wherein a reaction product between alumina and yttrium compound exists along an interface between the substrate and the yttrium compound film.

The present inventors discovered that when a film of the yttrium compound is formed on the alumina substrate by a special producing method mentioned later, the reaction product between the alumina and the yttrium compound is produced along the interface between them depending upon producing conditions. The inventors also discovered that when such a reaction product is produced, the film of the yttrium compound is not peeled even after heat cycles are applied, for example, between 800° C. and room temperature.

This reaction product is usually produced in a filmy form along the interface between the substrate and the yttrium compound, and constitutes an intermediate layer. This layer-like form of the reaction product may be continuous over the entire interface between the substrate and the yttrium compound, may be discontinuously formed at the interface between the substrate and the yttrium compound or may be formed in the form of plural layer-like islands. In this case, such layer-like islands do not continue to one another, but they exist in a layered form along the interface and constitute an intermediate layer, when viewed as a whole. The present invention includes cases where the reaction product exists in a dotted manner or are scattered at the interface between the substrate and the yttrium compound. The present invention includes such cases where the reaction product with a totally small area exists in the dotted manner or are scattered. Further, so long as the above reaction product is confirmed by an X-ray diffraction device, those cases fall in the scope of the present invention.

These and other objects; features and advantages of the invention will be appreciated upon reading the following description of the invention when taken in conjunction with the attached drawings, with the understanding that some modifications, variations and changes of the invention could be easily made by the skilled person in the art to which the invention pertains.

BRIEF DESCRIPTION OF THE DRAWINGS

For a better understanding of the invention, reference is made to the attached drawings, wherein.

DETAILED DESCRIPTION OF THE INVENTION

Figure 1:
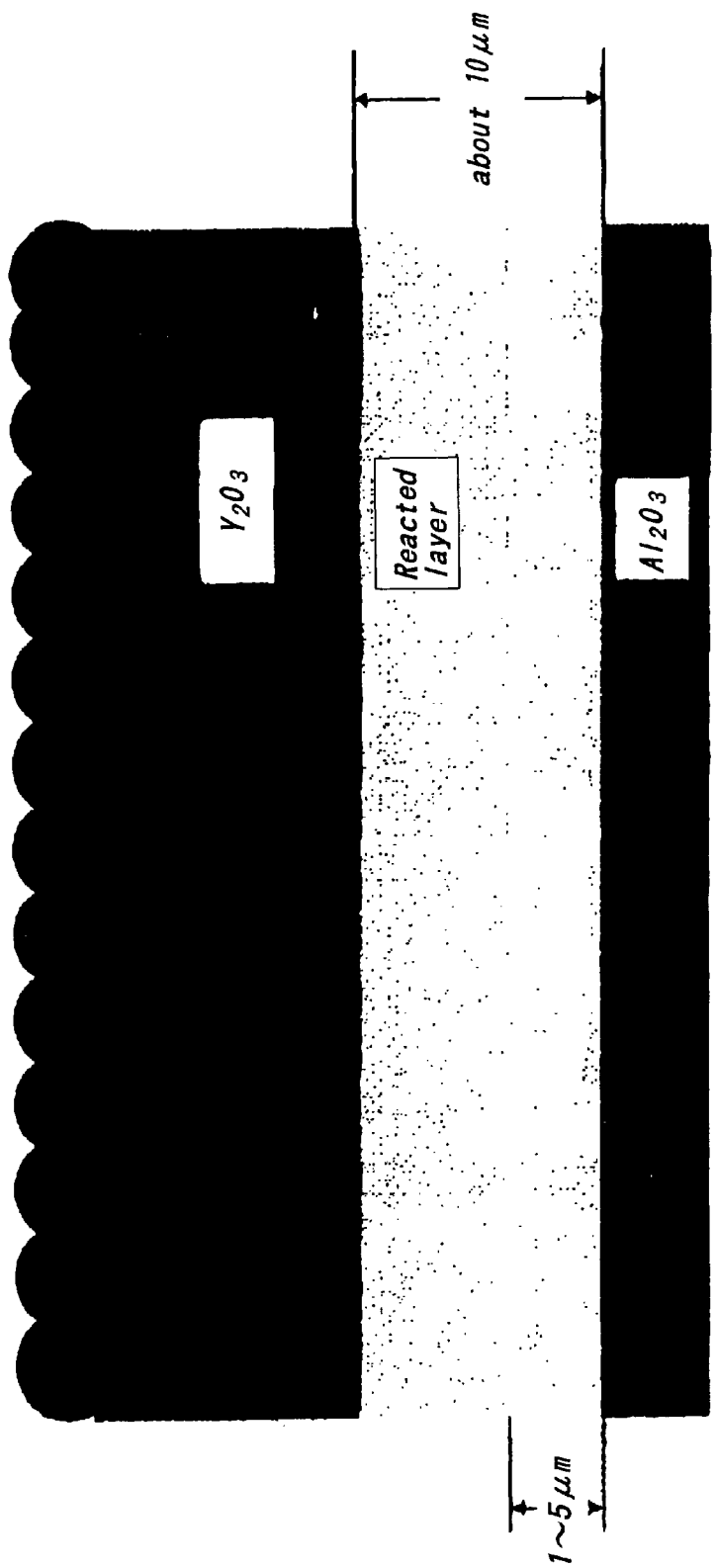
FIG. 1 is a view schematically showing the structure around an intermediate layer.

In the following, the first aspect of the present invention will be explained in more detail.

In a preferred embodiment of the first aspect of the present invention, the halogen gas plasma-resistive member comprises an intermediate layer between the main body of the member and the corrosion-resistant film, said intermediate layer having a coefficient of thermal expansion between those of said member main body and said corrosion-resistant film, respectively. In this case, the formation of particles due to peeling of the corrosion-resistant film can be prevented. A difference in coefficient of thermal expansion between the intermediate layer and the corrosion-resistant film is preferably not less than $3 \times 10^{-6}/°C$. A difference in coefficient of thermal expansion between the main body of the member and the intermediate layer is preferably not less than $5 \times 10^{-6}/°C$.

The intermediate layer preferably comprising a mixture, solid solution or a reaction product of material of the corrosion-resistant film and a constituting material of the main body. In this case, even if the corrosion-resistant film is exposed to the halogen gas plasma in a high temperature range, Othe production of the particles due to the peeling of the film can be prevented.

As mentioned above, the peeling resistance of the corrosion-resistant film in the present invention is obtained by utilizing the roughness of the substrate, that is, the anchoring effect, or by utilizing the stress inside the film occurring due to the thermal expansion difference, the chemical reaction or the phase transfer (a source for generating the stress inside the film is not limited to the intermediate layer only). As a matter of course, a porous material is used as the main body of the member, and the shrinkage of the main body through the thermal treatment after the coating may be utilized. Further, a chemical bonding action based on the chemical reaction at the interface may be utilized.

As a material of the corrosion-resistant film, yttrium compounds are preferred for their high corrosion resistance. Particularly, yttria, solid solutions containing yttria, composite oxides containing yttria, and yttrium trifluoride are preferred. More concretely, yttria, zirconia-yttria solid solution, rare earth oxide-yttria solid solutions, $3Y_2O_3$—$5Al_2O_3$, $YF_3$, Y—Al—(O)—F, $Y_2Zr_2O_7$, $Y_2O_3$—$Al_2O_3$, $2Y_2O_3$—$Al_2O_3$, etc. may be recited.

As the reaction product, the following may be recited.
(1) When the corrosion-resistant film is made of a compound containing yttrium and the main body is of alumina, $3Y_2O_3$—$5Al_2O_3$, $Y_2O_3$—$Al_2O_3$, $2Y_2O_3$—$Al_2O_3$.
(2) When the main body is made of aluminum, Al—$Y_2O_3$ cermet.
(3) When the main body is made of zirconia, $Y_2Zr_2O_7$.

It is preferable that fine particles having a particle size of 1 to 2 μm and voids exist at the interface between the reaction layer and the main body, and that the voids are surrounded with the fine particles constituting the reaction layer and the main body. Since the particles and the voids give a low Young's modulus, the film can be prevented from being peeled.

The underlying layer for the corrosion-resistant film may be either the main body of the member or the intermediate layer. The Young's modulus of such an underlying layer of the corrosion-resistant layer is preferably not more than 100 MPa.

The material of the main body is not particularly limited. However, it is preferable that the material does not contain any element which may afford adverse effects upon the processing in the plasma container. From this point of view, the material is preferably aluminum, aluminum nitride, aluminum oxide, a compound or a solid solution of aluminum oxide and yttrium oxide, zirconium oxide, or a compound or a solid solution of zirconium oxide and yttrium oxide.

The peeling resistance of the corrosion-resistant film to the main body is measured by a Sebastans test, assuming that the diameter of the bonded face is 5.2 mm.

When the corrosion-resistant film contains a yttrium compound, the concentration of iron atoms in the film is preferably not more than 300 ppm.

It is discovered that if a slight amount of iron atoms are mixed into the corrosion-resistant film, fine spots are conspicuously formed. In order to prevent such fine spots, the concentration of the iron atoms in the film needs to be suppressed to 30 ppm or less.

It is preferable to incorporate a compound of a rare earth element into the corrosion-resistant film. As such rare earth elements, La, Ce, Pr, Nd, Pm, Sm, Eu, Gd, Tb, Dy, Ho, Er, Tm, Yb and Lu are particularly preferred. As the compound, compounds which produce oxides by heating in air are preferred.

For example, the following methods may be recited to form the corrosion-resistant film in the present invention.
(1) A sprayed film is formed by spray coating a material for a corrosion-resistant film.
(2) A corrosion-resistant film is formed by chemical vapor deposition or electrochemical vapor phase deposition.
(3) A film is bonded to a molded body for a substrate, and the molded body is dipped in a film-forming material, followed by co-sintering.

In the above case (1), when a porous film is used as an intermediate layer constituting an underlying layer for the corrosive-resistant film, the Young's modulus of the intermediate layer can be made smaller than that of a compact body. Further, the material for the corrosion-resistant film can be firmly adhered to the intermediate layer. Particularly, if open pores which have small openings and expanded inner portions are formed in a surface portion of the intermediate layer, melted particles enter the open pores during spraying, and are solidified in the open pores, resulting in fixing the sprayed film onto the surface of the intermediate layer.

In order to form such a porous film, a paste composed at least of a raw powder for the porous film, a dispersing medium and a pore-forming agent is coated onto the main body of the member, and the thus formed coated layer is baked thereon. At that time, a number of open pores are formed in the porous film by the action of the pore-forming agent. By adjusting the amount of the pore-forming agent, openings of most of the open pores can be relatively made smaller. When the porous film is formed and its surface is polished, the closed pores appear as open pores most of which have relatively smaller openings.

As the pore-forming agent in the paste to be coated, acryl powder, carbon powder, cellulose, etc. are preferred. As the dispersing medium, water, turpentine alcohol, butyl carbitol, etc. are preferred. Further, it is preferable to incorporate a binder into the paste. As such a binder, polyvinyl alcohol, methyl cellulose, acrylic binder, etc. are preferred.

The material for the corrosion-resistant film is preferably sprayed in a low pressure state. This pressure is preferably not more than 100 Torr. By this, the pores of the sprayed film can be further decreased to further enhance the corrosion resistance of the corrosion-resistant film.

After the sprayed film is formed, it is further sintered by thermally treating the film (and the main body of the member, if necessary), thereby eliminating or decreasing the pores in the sprayed film. When the intermediate layer exists, the sprayed film, the intermediate film and the main body of the member may be thermally treated to sinter the sprayed film and eliminate or decrease the pores in the sprayed film. The thermal treating temperature is preferably not less than 1400° C. There is no upper limitation for the thermal treating temperature. When no intermediate layer is formed, the upper limit of the thermal treating temperature may be such that it may not denature the main body of the member. From this point of view, the temperature is preferably not more than 2000° C. Further, if a porous intermediate layer is formed, the thermal treating temperature is preferably not more than 1800° C. from the point of view of suppressing the sintering of the intermediate layer.

The present inventors discovered that the peeling resistance of the corrosion-resistant film can be remarkably increased by setting the thermal treating temperature for the sprayed film at not less than 1400° C. It is considered that if the thermal treating temperature reaches 1400° C., a reaction layer is likely to be formed between the material of the main body and that of the corrosion-resistant film, so that the peeling resistance of the corrosion-resistant film is increased.

On the other hand, if the thermal treating temperature for the sprayed film increases near to 1800° C., aluminum elements sometimes moved and were dispersed near the reaction layer once formed, which inversely decreased the peeling resistance of the corrosion-resistant film. From this point of view, the thermal treating temperature is preferably 1650° C., more preferably 1600° C., and particularly preferably 1550° C.

If the reaction layer is made of a uniform material, the thermal treating temperature is preferably not more than 1550° C.

In a preferred embodiment, a concentration ratio of the material of said corrosion-resistant film to the constituting material of the main body in the reaction layer increases in a direction from a side of the main body to that of the corrosion-resistant film. When such an inclined compositional intermediate layer is employed, it is easier to suppress the movement and the dispersion of the aluminum elements around the above-mentioned reaction layer during the thermal treatment, so that the peeling resistance is not so lowered even at the thermal treating temperature of 1600° C.

The lower limit in the thickness of the above-mentioned reaction layer is not particularly provided. Even if the reaction layer is very thin, the peeling resistance of the corrosion-resistant film is remarkably increased as compared with the case where no reaction layer is formed. The thickness of the reaction layer is more preferably not less than 3 µm, because of enhanced peeling resistance.

There is no upper limitation for the thickness of the reaction layer, but the peeling resistance of the corrosion-resistant film is particularly large by setting the thickness at not more than 20 µm. From this point of view, the thickness of the reaction layer is more preferably not more than 15 µm, and most preferably not more than 10 µm.

The pores in the surface of the sprayed film can be eliminated by depositing the material for the corrosion-resistant film on the sprayed film by chemical vapor deposition or the electrochemical vapor deposition.

The reason why such a high peeling resistance is obtained in the present invention is not clear. However, factors that enhance the peeling resistance generally include the anchoring effect between the substrate, the chemical reaction between the film and the substrate, the difference in thermal expansion between the substrate and the film, occurrence of the weak compression stress of the film following the thermal expansion or the phase change of the film and the substrate. It is considered that high peeling resistance can be realized in the present invention through mutual exhibition of these factors.

As the halogen gas, $ClF_3$, $NF_3$, CF-based gases such as $CF_4$, $WF_6$, $Cl_2$, $BCl_3$, etc. may be recited.

EXAMPLES AND COMPARATIVE EXAMPLES
(Experiment A)
(Production of Sample in Example 1-1)

A substrate was prepared from metallic aluminum in a flat planar shape of 40×40×0.5 mm in size. The center-line average surface roughness of the surface of the substrate was 1.3 µm. On this surface, a film of an intermediate layer was formed from aluminum-yttria cermet (Al:$Y_2O_3$=1:1 mol %) in a thickness of 10 µm by spraying. The coefficient of thermal expansion in a range of 40 to 100° C. was 15.3× $10^{-6}$/° C. The center-line average surface roughness Ra of the intermediate layer was 6.1 µm. The relative density of the intermediate layer was 82%.

A film of yttria was formed on the intermediate layer by spraying. More specifically, "VACTEX" $Y_2O_3$ powder manufactured by PLASMA-TECHNIK AG powder was used. During spraying, argon was flown at a flow rate of 40 liters/min., and hydrogen at 12 liters/mm. The spraying output was 40 kW, and the spraying distance 120 mm. The thickness of the yttria film was 60 µm. No peeling was observed between the intermediate layer and the yttria film.

Next, the intermediate layer and the aluminum layer were ground off from a rear face side of the yttria film. Then, after the yttria film Was thermally treated at 1500° C. for 3 hours, the film was cut into a test piece of 20×20×300 µm in size. The relative density of this test piece was 97%, and the center-line average surface roughness Ra and Wa (the average waveness) of the test piece were 5.7 µm and 3.8 µm, respectively. Ra and Wa were measured by using "Form Talysurf Series 2 S4" manufactured by Tayler-Hobson Co., Ltd. with a scanning length of 4.8 mm.

(Production of Sample in Comparative Example 1-1)

A test piece of 20×20×3 mm in size was produced from sintered alumina (relative density of 99.8%). The center-line average surface roughness Ra and Wa (the average waveness) were 0.3 µm and 0.1 µm, respectively.

(Corrosion Resistance Test)

The samples in Examples 1-1 and Comparative Example 1-1 were set inside a corrosion resistance tester, and tests were effected under the following condition. Each sample was held at 735° C. for 2 hours in a $NF_3$ down-flow plasma. The flow rate of the $NF_3$ gas was 75 sccm, and that of a carrier gas (nitrogen gas) 100 sccm. Excitation was effected by ICP (13.56 Hz, output 800 W), and the gas pressure was set at 0.1 Torr. With respect to each sample, the weight was measured before and after the exposure test, and a weight change was calculated.

TABLE 1-1

| | Weight loss in corrosion resistance test |
|---|---|
| Example 1-1 | 0.1 mg/cm$^2$ |
| Comparative Example 1-1 | 9.2 mg/cm$^2$ |

(Experiment B)
(Production of Sample of Example 1-2)

A main body was prepared from porous zirconia stabilized with 15 mol % CaO. More specifically, a powder of zirconia stabilized with 15 mol % CaO was kneaded with water and a binder, and the kneaded mixture was extruded through a die having a diameter of 50 mm. The molded body was dried and fired to obtain a sintered body, which was cut into the rod-shaped main body of 30 mm×200 mm×10 mm. The porosity and the Young's modulus of the main body were 30% and 60 GPa, respectively, and the center-line average surface roughness Ra and Wa of the main body were Ra=1.8 µm and Wa=1.3 µm.

A film of yttria was formed on the surface of the main body. More specifically, "VACTEX" $Y_2O_3$ powder manufactured by PLASMA-TECHNIK AG powder was used. During spraying, argon was flown at a flow rate of 40 liters/min., and hydrogen at 12 liters/min. The spraying output was 40 kW, and the spraying distance 120 mm. The thickness of the yttria film was 50 µm. No peeling was observed between the main body and the yttria film.

Next, the yttria layer and the main body were thermally treated at 1500° C. for 3 hours, and cut into a test piece of 20×20×300 µm in size. The test piece included the main body portion and the yttria film portion. The relative density of this yttria film was 96%, and Ra and Wa (the average waveness) of the test piece were 5.7 µm and 3.8 µm, respectively. Ra and Wa were 5.9 µm and 3.8 µm, respectively.

(Production of Sample in Example 1-3)

The yttria film of the sample in Example 1-2 was coarsely polished with #140 a diamond grinding stone. The center-line average surface roughness Ra and Wa of the coarsely polished yttria film were 1.5 µm and 1.4 µm, respectively.

(Production of Sample in Comparative Example 1-2)

A plane-shaped body having a size of 60×60×8 mm was prepared from yttria powder "UU-HP" manufactured by Shinetsu Kagaku Kabushiki Kaisha by mechanical pressing, and molded by isostatic hydrostatic pressing under pressure of 7 tons/cm². The molded body was fired at 1800° C. in air, thereby obtaining a sintered body. A sample of 20 mm×20 mm×3 mm in size was cut out from the sintered body, and its one main plane was polished with a "240 grinding stone (the other main plane not polished). The Ra and Wa of the polished plane were 0.8 μm and 0.7 μm, respectively.

(Production of Sample in Comparative Example 1-3)

A sample of 20 mm×20 mm×3 mm in size was cut out from the same sintered material of yttria oxide (relative density of 99.8%) as in Comparative Example 2. One main plane of the sample was ground with a #800 grinding stone. The Ra and Wa of this main plane were 0.1 μm and 0.2 μm, respectively.

(Corrosion Resistance Test)

With respect to Examples 1-2 and 1-3 and Comparative Examples 1-2 and 1-3, the corrosion resistance test was effected under the same condition as mentioned above. With respect to Examples 1-2 and 1-3, the test was effected in the state that the calcia-stabilized zirconia portion as the substrate was ground off. As a result, no difference was seen among the samples.

(Amount of Particles Held)

With respect to Examples 1-2 and 1-3 and Comparative Examples 1-2 and 1-3, the degree of particles held on the surface was measured according to the following method.

(1) Each sample was dried at 100° C. for 3 hours by heating, and placed and cooled to room temperature in a desiccator.
(2) The weight of each sample was measured by a chemical balance (resolution $10^{-4}$ g).
(3) Each ample was placed with its test face directed upwardly, and 2 g of alumina fine powder was placed on that test face. At that time, the fine powder was placed almost uniformly over the entire test face.
(4) The test face of the sample was directed downwardly (turned upside down).
(5) A tube was placed on a lower side of the sample. The inner diameter of the tube was 6.3 mm. An outlet of the tube was arranged at a location spaced from the test face (directed downwardly) by 20 mm. The tube was directed vertically to the test face. Argon gas was flown toward the center of the test face at a flow rate of 10 liters/min. for 1 minutes.
(6) The weight of each sample was measured again with the same balance as in the measurement before the attachment of the fine powder, and an absorbed amount of the powder was calculated.
(7) This procedure was repeated 5 times for each sample, the powder-adsorbed amount was measured each time, and the average value was taken as the average powder-adsorbed amount and given in Table 1-2.

TABLE 1-2

| Surface | Average powder attached amount (g/cm²) | Weight loss in corrosion resistance test (mg/cm²) |
|---|---|---|
| Example 1-2 | 6.2 × 10E (−4) | 0.2 |
| Example 1-3 | 7.5 × 10E (−5) | 0.1 |
| Comparative Example 1-2 | no weight gain detected | 0.1 |
| Comparative Example 1-3 | no weight gain detected | 0.2 |

In Table 1-2, abbreviations are used, and a figure after "E" denotes the number of a multiplier. Therefore, 6.2×10 E(−4) means $6.2 \times 10^{-4}$.

From the results, it is seen that each of the invention samples adsorbed the fine powder onto the test face and had the powder-holding power.

(Experiment C)

A main body having a size of 50×50×2 mm was first prepared from alumina with purity of 99.7%, and subjected to sand blasting. In the sand blasting, the sand-blowing pressure and the sand grain sizes were changed, and the source roughness Ra was adjusted to 0.5 to 3.1 μm (See Table3). Plural main bodies were prepared corresponding to each of the surface roughnesses shown in Table 1-3.

After the main body was ultrasonically cleaned with acetone, yttria was plasma sprayed onto the sand-blasted surface. The spraying condition was that argon and hydrogen were flown at flow rates of 40 liters/min. and 12 liters/min., respectively, the spraying output was 40 kW and the spraying distance was 120 mm. The thickness of the yttria film was 200 μm. The spraying condition was the same for all runs.

A part of samples belonging to each group having the same Ra was thermally treated at 1500° C. for 3 hours, and the remainder was left not thermally treated. Each of the thermally treated and not thermally treated samples was cut into a sample having a size of 10 mm×10 mm×2 mm, and the peeling resistance was measured.

The peeling resistance was measured by the following method.

1. A film-formed sample was cut in a size of 10 mm×10 mm×2 mm (including the thickness of the corrosion-resistant film).
2. The cut sample was ultrasonically cleaned with acetone for 5 minutes.
3. An adhesive-provided Al stud pin (manufactured by Phototechnica Co., Ltd.) was prepared. This bonding area had a circle shape of 5.2 mm in diameter.
4. The pin was bonded to a film-formed side.
5. The pin bonded to the sample was fitted to a jig, and pulled up by an "AUTOGRAPH," manufactured by Shimadzu Co., Ltd., until the film was peeled. The bonding strength was calculated from the bonding area and the load when the film was peeled (Peeling resistance peeling load/bonding area of the pin). At that time, the value in case that the peeling occurs at the location of the adhesive was not taken as a measurement value.

In this Experiment C, the relative density, the center-line average surface roughness Ra and Wa (average waveness) of,the corrosion-resistant film was 98.8 to 99.4%, 5.0 to 6.3 μm and 3.2 to 4.5 μm, respectively.

TABLE 1-3

| Run No. | Coarseness of underlying layer (Ra, μm) | Peeling resistance (MPa) | Heat treating temperature (° C.) |
|---|---|---|---|
| 1-1 | 0.5 | 0.5 | not thermally treated |
| 1-2 | 0.7 | 0.8 | not thermally treated |
| 1-3 | 1.2 | 2.2 | not thermally treated |
| 1-4 | 1.6 | 3.5 | not thermally treated |
| 1-5 | 2.1 | 3.9 | not thermally treated |
| 1-6 | 2.4 | 4.2 | not thermally treated |
| 1-7 | 2.8 | 4.9 | not thermally treated |
| 1-8 | 0.5 | 11 | 1500 |
| 1-9 | 0.7 | 14.0 | 1500 |
| 1-10 | 1.2 | 48.0 | 1500 |
| 1-11 | 1.6 | 52.0 | 1500 |
| 1-12 | 2.1 | 45.0 | 1500 |
| 1-13 | 2.4 | 29.0 | 1500 |
| 1-14 | 2.8 | 14 | 1500 |
| 1-15 | 3.1 | 10.0 | 1500 |

From the results, it is seen that the peeling resistance is extremely higher in Run Nos. 1-8 to 1-15 heated at 1500° C. as compared with Run Nos. 1-1 to 1-7 having undergone no thermal treatment. This is considered that the bonding strength in the samples having no thermal treatment is attributable to the physical bonding due to the anchoring effect, whereas that of the sample thermally treated at 1500° C. is attributable to the chemical bonding through a reaction phase between alumina and yttria. The sprayed film in the present invention may contain a glass phase. Since the glass phase is crystallized by the thermal treatment, it is considered that the film material itself is reinforced, which results in enhancement of the peeling resistance.

With respect to the samples having undergone no thermal treatment, as the surface roughness of the main body increased, the peeling resistance became higher. On the other hand, it was clarified that the peeling resistance was highest at around Ra=1.6 μm.

With respect to the samples having undergone no thermal treatment, it is considered that as the surface roughness increased, the anchoring effect of the corrosion-resistance film at the bonding interface between the film and the main body more strongly appeared. To the contrary, the reason why the peeling resistance was highest around Ra=around 1.6 μm in the samples thermally treated at 1500° C. can not be explained by the anchoring effect. Probably, it is considered that when the surface roughness Ra increases, voids remain in recesses at the time of the film formation in a case of the main body having a largely uneven surface, such voids act as structural defects. With respect to the samples thermally treated at 1500° C., since the bonding between the corrosion-resistant film and the main body is based on the chemical bonding, the bonding strength must begin to lower beyond Ra=around 1.6 μm to the degree that the structurally defect portions begins to increase. Further, it is considered that if the surface roughness was lower than Ra=around 1.6 μm, the area where the bonding was already insufficient before the thermal treatment increased to reduce the peeling strength.

As seen from the thermally treated samples in Table 1-3, it is preferable from the standpoint of view of the peeling resistance that the center-line average surface roughness Ra of the underlying layer is not less than 1.0 μm, more preferably 1.2 μm. On the other hand, Ra is preferably not more than 2.5 μm, more preferably not more than 2.0 μm.

When the corrosion-resistant member is to be produced, the mechanical peeling resistance is naturally necessary from the point of view of the durability of the film. From this point of view, the film-formed sample is preferably thermally treated. Further, the peeling resistance is preferably higher from the point of view of handling even after the spraying. The center-line average surface roughness Ra of the main body is preferably in a range of 1.2 to 5 μm from the total point of view.

(Experiment D)

Main bodies each having a size of 50×50×2 mm were prepared from alumina with purity of 99.7%, and their surfaces were subjected to sand blasting to adjust the surfaces of all the main bodies at Ra=1.6±0.1 μm. After each main body was ultrasonically cleaned with acetone, yttria was plasma sprayed onto the sand-blasted surface as a corrosion-resistant film. The spraying condition was that argon and hydrogen were flown at flow rates of 40 liters/min. and 12 liters/min., respectively, the spraying output was 40 kW and the spraying distance was 120 mm. The thickness of the yttria film was 200 μm. The spraying condition was the same for all the main bodies. Then, the spray film-formed samples were thermally treated at temperatures of 800 to 1600° C. (respective thermally treating temperatures shown in Table 1-4).

A test piece for the measurement of the peeling resistance (10 mm×10 mm×2 mm) and that for the measurement of the film open porosity (5 mm×10 mm×0.1 to 0.15 mm, cut from the film portion only) were cut out from each sample thermally treated at its temperature.

Peeling resistance was measured in the same manner as in Experiment C. The open porosity was measured according to the Archimedean method. Next, the sample for the measurement of the peeling resistance was cut vertically to the film, the exposed section was mirror polished, an interface between the main body and the corrosion-resistant film was observed with the scanning type electron microscope, and the thickness of the reaction layer was measured. Further, crystalline phases of reaction products were determined based on the film-formed sample in the peeling test and observation of a peeled face of the pin with the X-ray diffraction apparatus.

In the present Experiment D, the center-line average surface roughness Ra and Wa (average waveness) of the corrosion-resistant film were 4.9 to 6.6 μm and 3.2 to 4.2 μm, respectively.

TABLE 1-4

| Heat treating temperature (° C.) | Peeling resistance (MPa) | Open porosity (vol %) | Thickness of reacted layer (μm) |
|---|---|---|---|
| not thermally treated | 3.4 | 5.1 | no reacted layer |
| 800 | 4.6 | 5.1 | no reacted layer |
| 1000 | 2.1 | 5 | no reacted layer |
| 1200 | 18.0 | 2.5 | no reacted layer |
| 1400 | 42.0 | 1.4 | 3 |
| 1500 | 50.2 | 1.1 | 9 |
| 1550 | 31.5 | 0.9 | 15 |
| 1600 | 1.8 | 0.8 | 25 |

From the result, the peeling resistance was highest in the sample thermally treated at 1500° C. This is because when the thermally treating temperature is not less than 1400° C., alumina and yttria react to increase the bonding forces at the interface. However, if it is over 1550° C., the thickness of the reaction phase increases, which in turns tend to disperse too much atoms to form voids at the interface and thus to inversely reduce the peeling resistance. Therefore, when the thickness of the reaction layer is in a range of 3 μm to 20 μm, the peeling resistance is highest. From this point of view, the thickness of the reaction layer is most preferably in a range of 3 μm to 20 μm.

The reaction phase was composed of one or a mixture of $3Y_2O_3$—$5Al_2O_3$, $2Y_2O_3$—$Al_2O_3$2 and $Y_2O_3$—$Al_2O_3$.

As the thermal treating temperature increased, the porosity of the corrosion-resistant film decreased. When the corrosion resistance of the corrosion-resistant film is considered, both the peeling resistance and the denseness are necessary. Therefore, the thermal treatment is preferably effected at the thermal treating temperature of 1400 to 1550° C.

(Experiment E)

Main bodies each having a size of 50×50×2 mm were prepared from alumina with purity of 99.7%, and their surfaces were subjected to sand blasting to adjust the surfaces of all the main bodies at Ra=1.6±0.1 μm. After each main body was ultrasonically cleaned with acetone, plasma spraying was effected for an intermediate layer (totally 5 passes), while the composition of the powder was varied as follows (1st pass: alumina 100% powder, 2nd pass: alumina 80%-yttria 20% powder, 3rd pass: alumina 60%-yttria 40% powder, 4th pass: alumina 40%-yttria 60% powder and 5th pass: alumina 20%-yttria 80% powder). Thereafter, yttria was plasma sprayed as a corrosion-resistant film.

As to both the intermediate layer and the corrosion-resistant film, the spraying condition was that argon and hydrogen were flown at flow rates of 40 liters/min. and 12 liters/min., respectively, the spraying output was 40 kW and the spraying distance was 120 mm. The thickness of the yttria film was 200 μm. The spraying condition was the same for all the main bodies.

Then, the spray film-formed samples were thermally treated at temperatures of 1500 to 1600° C. A test piece for the measurement of the peeling resistance (10 mm×10 mm×2 mm) and that for the measurement of the film open porosity (5 mm×10 mm×0.1 to 0.15 mm, cut from the film portion only) were cut out from each sample thermally treated at its temperature.

Peeling resistance was measured in the same manner as in Experiment C. The open porosity was measured according to the Archimedean method. Next, the sample for the measurement of the peeling resistance was cut vertically to the film, the exposed section was mirror polished, an interface between the main body and the corrosion-resistant film was observed with the scanning type electron microscope, and analysis was effected the X-ray diffraction apparatus. The results revealed that the sample in this Experiment gave high peeling resistance of 35 MPa even at 1600° C. and the film porosity of 0.5% art this time.

In the present Experiment E, the center-line average surface roughness Ra and Wa (average waveness) of the corrosion-resistant film were 4.9 to 6.2 μm and 3.3 to 4.6 μm, respectively.

TABLE 1-5

| Heat treating temperature (° C.) | Peeling resistance (MPa) | Open porosity (vol %) |
|---|---|---|
| 1500 | 42.0 | 1 |
| 1550 | 48.0 | 0.8 |
| 1600 | 35.0 | 0.5 |

(Experiment F)

Main bodies each having a size of 50×50×2 mm were prepared from alumina with purity of 99.7%, and their surfaces were subjected to sand blasting to adjust the surfaces of all the main bodies at Ra=1.6±0.1 μm. After each main body was ultrasonically cleaned with acetone, a rare earth oxide shown in Table 1–6 was plasma sprayed as a corrosion-resistant film. With respect to a part of the rare earth oxides, zirconium oxide was incorporated for spraying.

As to both the intermediate layer and the corrosion-resistant film, the spraying condition was that argon and hydrogen were flown at flow rates of 40 liters/min. and 12 liters/min., respectively, the spraying output was 40 kW and the spraying distance was 120 mm. The thickness of the rare earth oxide film was 300 μm. Then, the spray film-formed samples were thermally treated at 1600° C.

A test piece for the evaluation of the halogen gas corrosion-resistance (10 mm×10 mm×0.1 to 0.15 mm, from the film portion only) was cut out from each sample, and subjected to the corrosion resistance test in the same manner as in Experiment A.

As compared with the sample made of alumina alone, the samples formed with the corrosion-resistant films of the rare earth oxide(s) exhibited far higher corrosion resistance against the halogen gas. The corrosion-resistant films each made of the rare earth oxide added with zirconium oxide exhibited smaller porosity and more excellent corrosion resistance.

In Experiment F, the center-line average surface roughness Ra and Wa (average waveness) of the corrosion-resistant film were 4.8 to 6.4 μm and 3.8 to 4.5 μm, respectively. In some of the multiple component system, there occurred multiple crystalline phases. As in the combination of 37.5 mo. % $Y_2O_3$ and 62.5 mol % $Al_2O_3$, the multiple phases gave better results with higher peeling strength as compared with the single phase.

TABLE 1-6

| Composition of corrosion-resistant film | Ra of corrosion-resistant film (μm) | Peeling resistance (MPa) | Open porosity (vol %) | Weight loss in corrosion resistance test (mg/cm$^2$) |
|---|---|---|---|---|
| $Y_2O_3$ | 3.2 | 35 | 0.6 | 0.2 |
| 10 mol % $La_2O_3$ · 90 mol % $Y_2O_3$ | 3.5 | 24 | 0.5 | 0.3 |
| $CeO_2$ | 2.8 | 23 | 1.2 | 0.2 |
| $Pr_2O_3$ | 3.1 | 32 | 0.9 | 0.3 |
| $Nd_2O_3$ | 3.2 | 30 | 0.8 | 0.2 |
| $Sm_2O_3$ | 4.3 | 29 | 0.9 | 0.2 |
| $Gd_2O_3$ | 3.8 | 31 | 1 | 0.3 |
| $Dy_2O_3$ | 2.9 | 28 | 1.2 | 0.2 |
| 37.5 mo. % $Y_2O_3$ · 62.5 mol % $Al_2O_3$ *1 | 3.4 | 22 | 0.9 | 0.1 |
| 37.5 mol % $Y_2O_3$ · 62.5 mol % $Al_2O_3$ *2 | 3.4 | 32 | 8 | 0.0 |
| (37.5 mol % $Y_2O_3$ · 150 μm) + $Y_2O_3$ (intermediate layer 150 μm) *2 | 3.3 | 52 | 7 | 0.0 |
| 90 mol % $Y_2O_3$ · 10 mol % $ZrO_2$ | 3.0 | 34 | 0.3 | 0.1 |
| 95 mol % (10 mol % $La_2O_3$ · 90 mol % $Y_2O_3$) 5 mol % $ZrO_2$ | 2.9 | 36 | 0.2 | 0 |
| 90 mol % $CeO_2$ · 10 mol % $ZrO_2$ | 3.5 | 30 | 0.6 | 0 |
| 90 mol % $Nd_2O_3$ · 10 mol % $ZrO_2$ | 3.2 | 28 | 0.4 | 0 |
| 90 mol % $Sm_2O_3$ · 10 mol % $ZrO_2$ | 3.1 | 29 | 0.3 | 0 |
| $Al_2O_3$ | 2.7 | 38 | 0.1 | 9.5 |

*1: only $5Al_2O_3 \cdot 3Y_2O_3$ detected
*2: $5Al_2O_3 \cdot 3Y_2O_3$, $Al_2O_3 \cdot Y_2O_3$ and $Al_2O_3 \cdot 2Y_2O_3$ detected As mentioned above, according to the present invention, the halogen gas plasma-resistant member to be exposed to the halogen gas plasma, which is hard to float particles due to corrosion inside the plasma vessel or fall and deposit on other members inside the vessel can be obtained.

In the following, the second aspect of the present invention will be explained in more detail.

The reaction product in the laminate according to the second aspect of the present invention preferably comprises a crystalline phase composed of a composite oxide of yttria and alumina.

(1) $Y_3Al_5O_{12}$(YAG), which contains yttria and alumina at a ratio of 3:5 with a garnet crystalline structure.
(2) $YAlO_3$(YAP), which has a perovskite-type crystalline structure.
(3) $Y_4Al_2O_9$(YAM), which has a monocrylic system.

Particularly, the intermediate layer contains a crystalline phase composed of yttrium-aluminum garnet and/or a crystalline structure of $Y_4Al_2O_9(2Y_2O_3$—$Al_2O_3)$.

As the yttrium compound constituting the film of the yttrium compound, yttria, yttria-containing solid solutions (zirconia-yttria solid solution, rare earth oxide-yttria solid solution), yttria-containing composite oxide (yttrium-aluminum garnet, $Y_4Al_2O_9(2Y_2O_3$—$AlO_3)$, $YAlO_3(Y_2O_3$—$Al_2O_3)$, yttrium trifluoride, Y—Al—(O)—F, $Y_2Zr_2O_7$, etc. may be recited. Particularly, the film of the yttrium compound contains at least yttria. As such a compound, yttria, the yttria-containing solid solution and the yttria-containing composite oxides may be included. Particularly, yttria alone or yttrium fluoride is preferred.

Further, the present inventors confirmed that there is, along the interface between the intermediate layer and the substrate, a microstructure in which fine particles composed of the same material as that of the intermediate layer and voids formed among the fine particles are arranged. Each void is defined by the substrate and the fine particles constituting the intermediate layer. When the laminate has such a peculiar fine structure, adhesion of the yttria film to the substrate is further enhanced. It is considered that this portion mitigates a difference in Young's modulus between the substrate and the yttrium compound film.

The lower limit for the thickness of the intermediate layer is not particularly posed. Even if the intermediate layer is very thin, the peeling resistance of the corrosion-resistant film is remarkably enhanced as compared with a case where no intermediate layer is formed. The thickness of the intermediate layer is preferably not less than 3 $\mu$m, because the peeling resistance is improved.

Further, there is no upper limitation for the intermediate layer, either. In actual, the intermediate layer having a thickness of 30 $\mu$m or less is easily produced. If the intermediate layer is not more than 20 $\mu$m, the peeling resistance of the yttria compound film becomes particularly large. From this point of view, the thickness of the intermediate layer is more preferably not more than 15$\mu$.

When the laminate is to be applied in uses requiring high purity of the yttrium compound, particularly to the semiconductor-producing apparatus, for example, it is preferable that the content of alkali metals, alkaline earth metals and transition metals is as smaller, more preferably the total content is preferably not more than 100 ppm, and more preferably not more than 30 ppm. This content is measured by quantitative analysis with an induction coupling plasma.

Particularly, the content of iron atoms in the film of the yttrium compound is preferably not more than 30 ppm (as calculated in the form of Fe atoms themselves).

It was discovered that even if a slight amount of iron atoms enter the film of the yttrium compound, conspicuous fine spots are formed on the film surface. In order to prevent such fine spots, the concentration of iron atoms in the corrosion-resistant film needs to be not more than 20 ppm.

In order to produce the laminate according to the second aspect of the present invention, a sprayed film is formed on the substrate or its precursor by spraying the yttrium compound, and this film is thermally treated.

The substrate may be made of a dense sintered alumina, but it may be a porous sintered body. Alternatively, an alumina substrate may be formed by forming a paste layer or coated layer containing alumina on another substrate and sintering the pasted or coated layer by post thermal treatment. The shape of the substrate is not particularly limited, and may be planar or filmy.

The substrate is preferably porous. Further, the center-line average surface roughness Ra of the surface of the substrate is preferably not less than 1 $\mu$m, more preferably not less than 1.2 $\mu$m. In that case, the adhesion of the corrosion-resistant film to the underlying layer can be enhanced to prevent the formation of the particles due to the peeling of the film.

When the porous body is used as the substrate, the Young's modulus can be made smaller than a case where a dense body is used. Further, the adhesion of the film of the yttrium compound to the substrate can be made firmer. Particularly, if open pores having smaller openings and expanded inner portions are formed in the surface portion of the substrate, the particles are melted and enter the open pores during the spraying, is solidified therein, which fixes the sprayed film onto the surface.

When a film of the yttrium is to be formed on the substrate by spraying, the compound is sprayed preferably under a low pressure. This pressure is preferably not more than 100 Torr. In the spraying under the low pressure, the pores in the sprayed film can be further decreased to further improve the corrosion resistance of the final film.

When the sprayed film and the substrate or its precursor are thermally treated after the formation of the sprayed film to sinter at least the sprayed film, the pores in the sprayed film can be eliminated or reduced. The thermal treating temperature is preferably not less than 1300° C. to produce the intermediate layer. The upper limit for the thermal treating temperature is not more than 1800° C. The thermal treating time is preferably not less than 1 hour.

In order to uniformly heat the substrate and the film and effect the reaction, the heating rate during the thermal treatment is preferably not more than 200° C./hour in a range of 1200° C. or more. In order to prevent cracking of the substrate and the film, the cooling rate is preferably not more than 200° C./hour. The thermal treating atmosphere may be air. The thickness of the intermediate layer and the sizes of the crystalline particles in the yttrium compound film may be controlled based on the thermal treating time and the thermal treating temperature. As the thermal treating time period prolongs and the temperature rises, the thickness of the intermediate layer increases, and the crystalline particles become greater.

Since the coefficient of yttria is near to that of alumina, it is considered that no attention has been heretofore paid to effect a special thermal treatment to mitigate the difference in thermal expansion between them.

The present inventors further discovered that when the temperature for thermally treating the sprayed film is set at not less than 1400° C., the peeling resistance of the corrosion-resistant film remarkably increases. It is considered that when the thermal treating temperature reaches 1400° C., a reaction layer is likely to be formed between the material of the main body and that of the corrosion-resistant film to consequently enhance the peeling resistance of the corrosion-resistant film.

On the other hand, if the temperature for thermally treating the sprayed film approaches 1800° C., aluminum elements near the reacted layer once formed move and diffuse, which sometimes inversely lower the peeling resistance of the corrosion-resistant film. From this point of view, the thermal treating temperature is preferably not more than 1650° C., more preferably not more than 1600° C., and particularly preferably not more than 1550° C.

The peeling resistance of the yttrium compound film to the substrate is preferably not less than 15 MPa when measured according to a method mentioned later with the diameter of a bonded face being 5.2 mm.

For example, it was clarified that in the laminate thermally treated as above, for example, 15 MPa or more, for example 35 MPa or more can be realized for the peeling resistance of the yttrium compound film to the substrate. Particularly, when thermally treated at 1500 to 1600° C., high peeling resistance of not less than 20 MPa, further not less than 35 MPa was obtained.

On the other hand, a laminate according to the present invention can be produced by obtaining a laminate molded body through successively laminating a layer of alumina powder, a layer of mixed powder composed of yttrium compound powder (e.g., yttria powder) and alumina powder, and a layer of a yttrium compound powder (e.g., yttria powder), and co-sintering the laminate molded body at 1500 to 1600° C.

Objects in which the corrosion-resistant members need to exhibit corrosion resistance include semiconductor-producing apparatuses such as hot CVD apparatuses. In such a semiconductor-producing apparatus, a semiconductor-cleaning gas composed of a halogen-based corrosive gas. The corrosion-resistant members may be applied to the semiconductor-producing apparatuses which exhibit corrosion resistance against not only the halogen gas plasma but also a mixed plasma atmosphere of the halogen gas and oxygen gas.

As the halogen gas, $ClF_3$, $NF_3$, $CF_4$, $WF_6$, $Cl_2$, $BCl_3$, etc. may be recited.

The center-line average surface roughness Ra and the waveness Wa of the film of the yttrium compound are preferably set at not less than 3 $\mu$m and not less than 1 $\mu$m, respectively. This makes difficult the particles formed through the corrosion of the members in the semiconductor-producing apparatus and working of the wafers therein to be floated in the space inside a vessel or fall or deposit upon other members in the vessel.

This is considered that the yttrium compound film makes it difficult for the particles to be formed and the Ra of the yttrium compound increases (unevenness remains at the surface), and consequently a small amount of particles formed by corrosion and working of wafer are retained at the surface of the yttrium compound film to prevent the particles from being floating in the space and falling and deposition upon other members.

The large Ra (roughness) of the surface of the corrosion-resistant film means that uneven portions remain at the surface of the film. When the surface is microscopically viewed, there are recesses and their adjacent projections. The projections are made of particles that project from adjacent recesses. Therefore, it was considered that when the Ra of the surface of the corrosion-resistant film is increased, the halogen gas plasma enters the recesses at the surface, grain boundaries are corroded from root portions of the projections (particles), and thus the formation of the particles is promoted. However, the larger Ra less contributes to increase in such particles, but on the contrary prevents the floating in the space inside the container and falling of the particles.

Since too large Ra promotes the corrosion of the surface of the corrosion-resistant film and thus increases the particles, Ra is preferably not more than 20 $\mu$m from this point of view, more preferably not more than 8 $\mu$m. The waveness Wa of the film is preferably not more than 3 $\mu$m.

EXAMPLES AND COMPARATIVE EXAMPLES

Comparative Examples 2-1

(Producing Method)

A substrate of alumina having a purity of 99.6 wt % and an open porosity of not more than 0.1% was ultrasonically cleaned with acetone, and yttria having a purity of 99.9 wt % was sprayed thereon. The spraying condition was that argon and hydrogen were flown at flow rates of 40 liters/min. and 12 liters/min, respectively, the spraying output was 40 kW, and the spraying distance 120 mm. The thickness of the yttria film was 60 $\mu$m. No peeling was observed between the intermediate layer and the yttria film. The spraying condition was the same for the following Examples and Comparative Examples.

The thickness of the sprayed film was 48 $\mu$m. The thickness of the sprayed film was determined by measuring the thickness of a sample with a micrometer before and after the spraying, effecting such measurements at another four points and calculating the average measurement value in the difference in the thickness of the sample between before and after the measurement among the totally five points. A difference between the maximum and the minimum among the measurement values of the film thickness was 9 $\mu$m. None of the sprayed substrates were thermally treated at all.

(Evaluation Results)

The state of each film was observed with the scanning type electron microscope, an energy dispersion type X-ray spectroscope and the X-ray diffraction apparatus.

(Surface)

Figure 2:
FIG. 2 is a photograph (magnification: 5000 times) photographed with a scanning type electron microscope showing a surface of a sample in Comparative Example 2-1.

The crystalline phase of the yttria film was analyzed with the X-ray diffraction apparatus. X-rays were irradiated upon the film from the upper side. The crystalline phases of yttria included a cubic system and a monoclinic system. Cracks being 5 to 10 $\mu$m long and around 0.1 to 0.5 $\mu$m wide were observed at the surface of the sprayed film. Three to five of such cracks appeared per 100 $\mu$m² (See FIG. 2).

(Sectional Surface)

Figure 3:
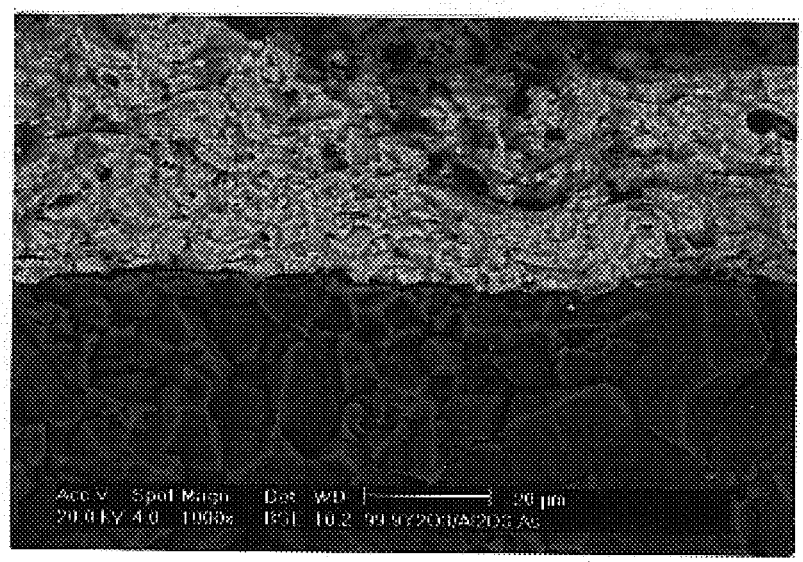
FIG. 3 is a photograph (magnification: 1000 times) photographed with the scanning type electron microscope showing a sectional surface of the sample in Comparative Example 2-1.

A layered structure is seen in a film of yttria (FIG. 3). Since the yttria layer has the layered structure, it was anticipated that the structure was likely to peel. About 1 to 5 $\mu$m pores were observed. However, no through hole from the surface of the film to the alumina substrate was present.

(Surface Roughness)

The center-line average surface roughness Ra of the surface of the film was 3.5 $\mu$m.

(Waveness)

Wa (average waveness) was 2.5 $\mu$m. Ra and Wa were measured by using "Form Talysurf 2 S4" manufactured by Tayler-Hobson Co., Ltd. with a scanning length of 4.8 mm.

(Peeling Test)

A tape "Nice tack" manufactured by Nichiban Co., Ltd. was bonded to the film, and a peeling test was effected. As a result, the film was peeled over the entire surface, and bonded to the tape.

(Peeling Resistance)

1. A film-formed sample was cut in a size of 10 mm×10 mm×2 mm (including the thickness of the yttrium compound film).

2. The cut sample was ultrasonically cleaned with acetone for 5 minutes.
3. An epoxy based adhesive-attached Al stud pin (manufactured by Phototechnica Co., Ltd.) was prepared. This bonding area had a circle shape of 5.2 mm in diameter.
4. The stud pin was contacted with the yttrium compound film, and they were fixedly bonded to each other by heating at 150° C. for 1 hour.
5. The stud pin and the laminate were fixed to upper and lower chuck portions of a tensile test device, respectively. The stud pin was pulled away from the laminate at a speed of 0.5 mm by an "AUTOGRAPH," manufactured by Shimadzu Co., Ltd., until the film is peeled. The bonding strength was calculated from the bonding area and the load when the film was peeled (Peeling resistance= peeling load/bonding area of the pin). At that time, the value of the case when the peeling occurred at the location of the adhesive was not taken as a measurement value.

(Grinding)

When the surface of the film was coarsely ground with a #140 diamond grinding stone, the film was peeled.

(Corrosion Resistance Test)

The instant sample was held at 735° C. for 2 hours in a $ClF_3$ down-flow plasma. The flow rate of the $ClF_3$ gas was 75 sccm, and that of a carrier gas (nitrogen gas) 100 sccm. Excitation was effected with an induction coupling plasma (13.56 Hz, output 800 W), and the gas pressure was set at 0.1 Torr. Then, observation of a sectional surface with the scanning type electron microscope revealed that the film peeled from the substrate.

(Heat Cycling Test)

Ten heating/cooling cycles were effected. In one cycle, the sample was heated up to 800° C. at 800° C./min., heated at 800° C. for one hour, and rapidly cooled to room temperature at 400° C./min., and then heated again to 800° C. for one hour. After the above cycles, the weight change of the sample was 0.2 mg/cm$^2$. Then, the above peeling test was effected, which revealed that the film was peeled over the entire surface.

Example 2-1

(Producing Method)

Yttria having a purity of 99.9 wt % was sprayed on a substrate of alumina having a purity of 99.6 wt % and an open porosity of not more than 0.1%. The thickness of the sprayed film was 46 μm. A difference between the maximum and the minimum among the measurement values of the film thickness was 15 μm. The heating rate was 200° C./hour in a range of not less than 1200° C. The cooling rate was 150° C./hour.

(Surface)

Figure 4:
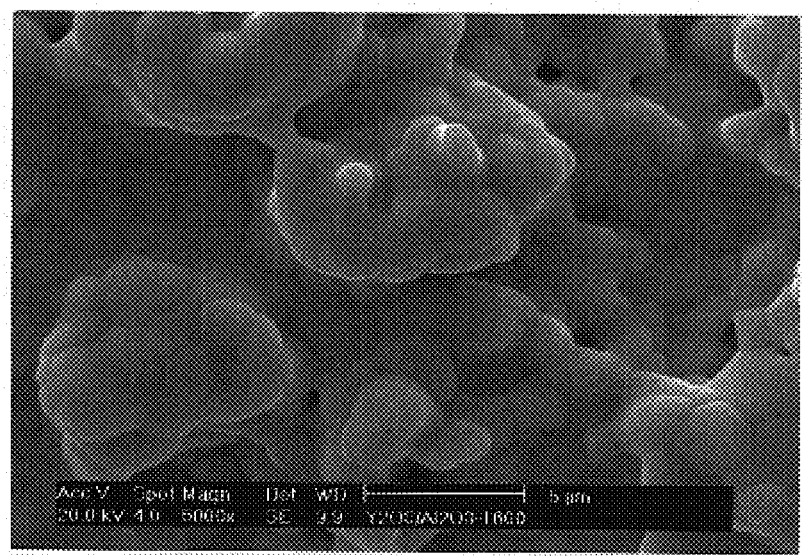
FIG. 4 is a photograph (magnification: 5000 times) photographed with the scanning type electron microscope showing a surface of a sample in Example 2-1 (thermally treated at 1600° C. for 3 hours)

The film had a structure in which yttria particles being 1 to 3 μm were sintered (FIG. 4). The crystalline phase of the yttria film was analyzed with the X-ray diffraction apparatus. The X rays were irradiated from the upper side of the film. $Y_2O_3$ of yttria having a cubic system was detected. A half-width value (FWHM) of a peak of the surface of the thermally treated film was smaller as compared with that of the product not thermally treated (Comparative Example 2-1). This shows that the thermal treatment at 1600° C. enhanced the crystallinity of yttria constituting the film. Table 1 shows the half-width values of main diffraction peaks of cubic yttria of instant Example 2-1 and the sample not thermally treated (Comparative Example 2-1).

TABLE 2-1

| | Location of peak (2θ) | | | |
|---|---|---|---|---|
| | 29.1 | 33.7 | 48.5 | 57.6 |
| Half-width value (Example 2-1) | 0.14 | 0.14 | 0.12 | 0.12 |
| Half-width value (Comparative Example 2-1) | 0.16 | 0.24 | 0.31 | 0.19 |

(Sectional Face)

Figure 5:
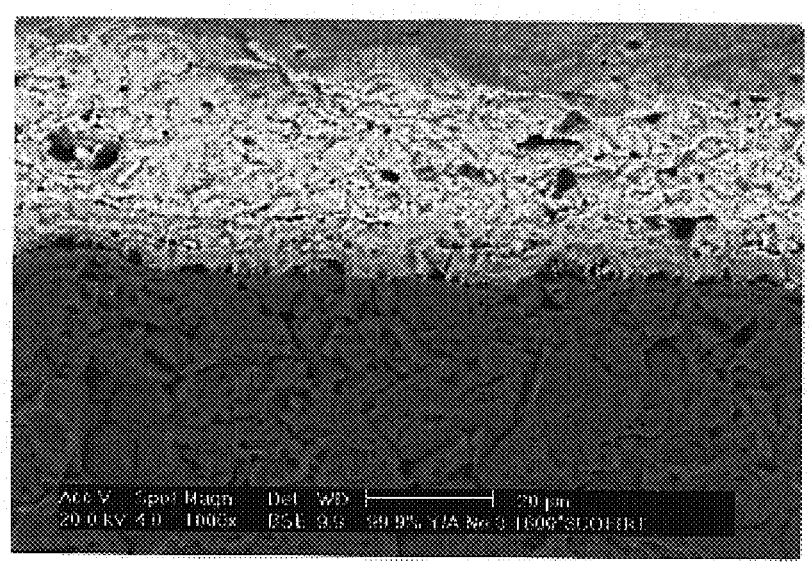
FIG. 5 is a photograph (magnification: 1000 times) photographed with the scanning type electron microscope showing a sectional surface of a sample in Example 2-1 (thermally treated at 1600° C. for 3 hours)

No peeling of the film was observed. Pores of about 1 to 5 μm were observed. However, no through-holes from the surface of the film to the alumina substrate appeared (FIG. 5). The layered structure observed inside the yttria film before the heat treatment disappeared.

(Interface between the Yttria Film and the Alumina Substrate)

A reaction layer of about 10 μm was produced at the boundary between the yttria film and the alumina substrate. It was confirmed by the analysis with the energy dispersed type X-ray diffraction spectroscope that the reaction layer was produced through the reaction between the alumina and the yttria. Further, the X-ray diffraction results revealed that the crystalline phase of the reaction layer comprised of $Y_3Al_5O_{12}$(YAG) and $Y_4Al_2O_9$. Considering the denseness of the alumina substrate (open porosity, 0%) and the porosity of the yttria film, it was presumed that the alumina ($Al_2O_3$) was diffused into the yttria film (YAM). There are fine particles of 1~2 μm and voids at the boundary between the reaction layer and the alumina substrate. Such voids are surrounded or defined by the fine particles constituting the reaction layer and the alumina substrate. Since the alumina substrate and the reaction layer contact with react other through the reaction fine particles, it might be anticipated that the adhesion between them was deteriorated. However, it is anticipated that the particles mitigate a difference in the Young's modulus between the reaction layer and the alumina substrate to make it difficult to peel the film from the substrate.

FIG. 1 shows the structure of a sectional face of the film which is in conformity with the observation results with the scanning type electron microscope, the energy dispersion type X-ray spectrometer, and the X-ray diffraction apparatus. There is a reaction layer of about 10 μm between alumina and yttria on the alumina substrate, while the yttria layer exists on the reaction layer.

(Surface Roughness)

The center-line average surface roughness Ra of the surface of the film was 4.3 μm.

(Waveness)

"Wa (average waveness) was 2.5 μm. Ra and Wa were measured by using "Form Talysurf 2 S4" manufactured by Tayler-Hobson Co., Ltd. with a scanning length of 4.8 mm")

(Peeling Test)

A tape "Nice tack" manufactured by Nichiban Co., Ltd. was bonded to the film, and a peeling test was effected. As a result, the film was peeled over the entire surface, and bonded to the tape.

(Grinding)

The surface of the film was coarsely ground with a #140 diamond grinding stone. The film was not peeled at the interface. Further, although the film was ground with a #1000 grinding stone, the film was not peeled at the interface (No peeling of the film was confirmed by the peeling test).

(Corrosion Resistance Test)

The test was effected in a $ClF_3$ down-flow plasma in the same manner as in Comparative Example 2-1. Although the weight of the sample was measured with the chemical balance after the test, the weight change was not more 0.2 mg/cm². Further, observation of a sectional face with the scanning type electron microscope revealed no peeling of the film. No peeling was observed in the above peeling test.
(Heat Cycling Test)

Heat cycling was effected as in Comparative Example 2-1. The weight change after this was not more than 0.2 mg/cm². No peeling was observed in the above peeling test.

The coefficients of thermal expansion (ppm/k) of alumina, YAG and yttria are 8.5, 8.4 and 8.1, respectively. The coefficient of the sample prepared in this Example gradually inclinedly changed. It was considered that this contributed to no peeling of the film.

Examples 2-2 to Example 2-10

Each sample having a sprayed film thickness of about 50 to 100 μm was thermally treated at 1600° C. for 3 hours, and results are shown in Tables 2-2 to 2-5. The Ra of the surface of each substrate was changed as shown in the Tables by sand blasting the surface of the substrate before the spraying.

TABLE 2-2

|  | Density of alumina | Ra of substrate surface (μm) | Film thickness before thermal treatment (μm) | Thermal treatment condition | Film properties | | | | | | |
|---|---|---|---|---|---|---|---|---|---|---|---|
|  |  |  |  |  | Peeling test | Ra (μm) | Wa (μm) | Peeling resistance (MPa) | Microstructure observed | | |
|  |  |  |  |  |  |  |  |  | Surface structure | Sectional structure | Thickness of reacted layer (μm) |
| Example 2-1 | 3.96 | 1.7 | 46 | 1600° C. 3 hours | not peeled | 4.3 | 2.2 | 30 | 1~3 μm sintered particles, not cracked | 1~5 μm pores | 10 |
| Example 2-2 | 3.96 | 1.9 | 88 | 1600° C. 3 hours | not peeled | 4.8 | 2.1 | 34 | 1~3 μm sintered particles, not cracked | 1~5 μm pores | 8 |
| Example 2-3 | 3.96 | 1.6 | 51 | 1700° C. 3 hours | not peeled | 4.9 | 2.5 | 23 | 1~3 μm sintered particles, not cracked | 1~5 μm pores | 12 |
| Example 2-4 | 3.96 | 1.5 | 92 | 1700° C. 3 hours | not peeled | 4.2 | 2.3 | 24 | 1~3 μm sintered particles, not cracked | 1~5 μm pores | 11 |
| Example 2-5 | 3.96 | 1.9 | 45 | 1600° C. 5 hours | not peeled | 4.9 | 2.6 | 26 | 1~3 μm sintered particles, not cracked | 1~5 μm pores | 12 |
| Example 2-6 | 3.96 | 1.7 | 97 | 1600° C. 5 hours | not peeled | 5.1 | 2.0 | 25 | 1~3 μm sintered particles, not cracked | 1~5 μm pores | 11 |

TABLE 2-3

|  | Crystalline phase of film | | Corrosion resistance test | | Heat cycling test | |
|---|---|---|---|---|---|---|
|  | Surface of $Y_2O_3$ film | Reacted layer | Appearance | Peeling test | Appearance | Peeling test |
| Example 2-1 | Cubic-$Y_2O_3$ | YAG YAM | no change | film not peeled | no change | film not peeled |
| Example 2-2 | Cubic-$Y_2O_3$ | YAG YAM | no change | film not peeled | no change | film not peeled |
| Example 2-3 | Cubic-$Y_2O_3$ | YAG YAM | no change | film not peeled | no change | film not peeled |
| Example 2-4 | Cubic-$Y_2O_3$ | YAG YAM | no change | film not peeled | no change | film not peeled |
| Example 2-5 | Cubic-$Y_2O_3$ | YAG YAM | no change | film not peeled | no change | film not peeled |
| Example 2-6 | Cubic-$Y_2O_3$ | YAG YAM | no change | film not peeled | no change | film not peeled |

TABLE 2-4

|  | Density of alumina | Ra of substrate surface (μm) | Film thickness before thermal treatment (μm) | Thermal treatment condition | Film properties | | | | | | |
|---|---|---|---|---|---|---|---|---|---|---|---|
|  |  |  |  |  | Peeling test | Ra (μm) | Wa (μm) | Peeling resistance (MPa) | Microstructure observed | | |
|  |  |  |  |  |  |  |  |  | Surface structure | Sectional structure | Thickness of reacted layer (μm) |
| Example 2-7 | 3.96 | 1.6 | 47 | 1600° C. 7.5 hours | not peeled | 4.7 | 2.1 | 20 | 1~3 μm sintered fine particles, not cracked | 1~5 μm pores | 19 |
| Example 2-8 | 3.96 | 1.9 | 100 | 1600° C. 7.5 hours | not peeled | 4.6 | 2.0 | 18 | 1~3 μm sintered fine particles, not cracked | 1~5 μm pores | 20 |
| Example 2-9 | 3.96 | 1.5 | 49 | 1600° C. 7.5 hours | not peeled | 4.5 | 2.2 | 15 | 1~3 μm sintered fine particles, not cracked | 1~5 μm pores | 15 |

TABLE 2-4-continued

| | | Ra of substrate surface (μm) | Film thickness before thermal treatment (μm) | Thermal treatment condition | Film properties | | | | Microstructure observed | | |
|---|---|---|---|---|---|---|---|---|---|---|---|
| | Density of alumina | | | | Peeling test | Ra (μm) | Wa (μm) | Peeling resistance (MPa) | Surface structure | Sectional structure | Thickness of reacted layer (μm) |
| Example 2-10 | 3.96 | 2.0 | 99 | 1600° C. 10 hours | not peeled | 5.1 | 2.4 | 17 | 1~3 μm sintered fine particles, not cracked | 1~5 μm pores | 16 |
| Comparative Example 2-1 | 3.96 | 1.7 | 48 | | entire surface peeled | 3.5 | 2.5 | 0.2 | 5~10 μm long and 0.1~0.5 μm wide cracks at density of 3~5 per 100 μm² | 1~5 μm pores | no reaction phase |

TABLE 2-5

| | Crystalline phase of film | | Corrosion resistance test | | Heat cycling test | |
|---|---|---|---|---|---|---|
| | Surface of $Y_2O_3$ film | Reacted layer | Appearance | Peeling test | Appearance | Peeling test |
| Example 2-7 | Cubic-$Y_2O_3$ | YAG, YAM | no change | film not peeled | no change | film not peeled |
| Example 2-8 | Cubic-$Y_2O_3$ | YAG, YAM | no change | film not peeled | no change | film not peeled |
| Example 2-9 | Cubic-$Y_2O_3$ | YAG, YAM | no change | film not peeled | no change | film not peeled |
| Example 2-10 | Cubic-$Y_2O_3$ | YAG, YAM | no change | film not peeled | no change | film not peeled |
| Comparative Example 2-1 | Cubic-$Y_2O_3$ Monoclinic-$Y_2O$ | — | 80% film peeled | 100% film peeled | no change | 100% film peeled |

In Examples 2-2, thermal treatment was effected at 1600° C. for 3 hours (same as in Example 2-1). However, the thickness of the sprayed film was as great as 88 μm. Results in Examples 2-2 were the as those in Example 2-1. In Example 2-3, the sprayed film was thermally treated at 1700° C. for 3 hours. Although the results were almost the same as those in Example 2-1, the reaction layer was slightly thicker. In Example 2-4, a slightly thicker sprayed film was thermally treated under the same condition as in Example 2-3, results were similar to those in Examples 2-3. In Examples 2-5 and 2-6, the thermal treating temperature of the sprayed film was 1600° C., and the treating time was prolonged to as much as 5 hours. Consequently, almost same results as in Examples 2-1 and 2-2 were obtained, but the thickness of the reaction layer was slightly thicker.

In Examples 2-7, 2-8, 2-9 and 2-10, the treating time was further prolonged as compared with Examples 2-5 and 2-6. Consequently, there was a tendency that as the treating time increased, the intermediate layer became thicker.

Figure 6:
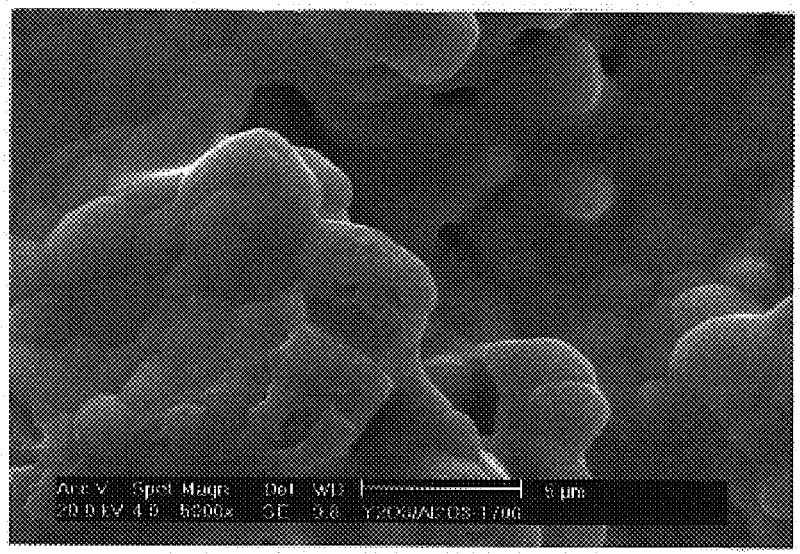
FIG. 6 is a photograph (magnification: 5000 times) photographed with the scanning type electron microscope showing a surface of a sample in Example 2-3 (thermally treated at 1700° C. for 3 hours)
Figure 7:
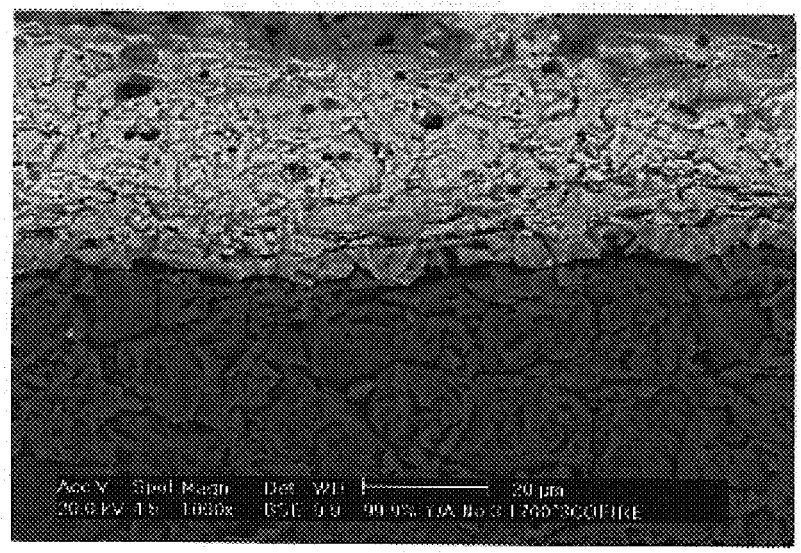
FIG. 7 is a photograph (magnification: 1000 times) photographed with the scanning type electron microscope showing a sectional surface of a sample in Example 2-3 (thermally treated at 1700° C. for 3 hours).

With respect to Example 2-3 (thermally treated at 1700° C. for 3 hours), FIG. 6 shows a scanning type electron microscope photograph of a surface of the sample, and FIG. 7 shows that of a sectional face around the interface between the yttria film and the alumina substrate. The interior of the yttria film took a structure in which yttria particles of 2 to 5 μm were sintered. As compared with the sample thermally treated at 1600° C., the grain growth advanced. The microstructures of the film, the intermediate layer and the substrate were the same as those in Example 2-1.

Examples 2-11 to 2-12

(Producing Method)

Commercially available alumina was molded and fired to prepare an alumina substrate (In Example 2-11, density: 3.56 g/cm³, porosity: about 10%; in Example 2-12, density: 3.76 g/cm³, porosity: about 5%; in Examples 2-1 to 2-10, Comparative Example, density: 3.96 g/cm³). Yttria having a purity of 99.9 wt% was sprayed on each of the substrates. The alumina substrate had a size of 10×10×2 mm. The thickness of the sprayed film was 91 μm. The thickness of the sprayed film was determined by measuring the thickness of the sample with the micrometer before and after the spraying, effecting such measurements at another four points and calculating the average measurement value in the difference in the thickness of the sample between before and after the measurement among the totally five points. A difference between the maximum and the minimum among the measurement values of the film thickness was 19 μm. A difference between the maximum and the minimum among the measurement values of the film thickness was 19 μm. The heating rate was 200° C./hour in a range of not less than 1200° C. The cooling rate was 150° C./hour.

The thus obtained samples were subjected to the same tests as in Examples 2-1 to 2-10, results are shown in Tables 2-6 and 2-7. The following are seen from the results in Tables 2-6 and 2-7. When heated at 1600° C., the density of the alumina substrate was not less than 3.9 g/cm³. Even when the alumina substrate was shrunk by the thermal treatment, no peeling was seen for the yttria film. Although Examples 2-11 to 2-12 were subjected to the peeling test in the same manner as in Examples 2-1 to 2-10, no peeling was seen. It was anticipated that the structure composed of fine particles of YAG and YAM and voids in the reaction layer mitigated shrinkage strain though the thermal treatment of the alumina substrate and the yttria film to give the film having enhanced adhesion.

TABLE 2-6

| | Density of alumina | Film thickness before thermal treatment (μm) | Thermal treatment condition | Film properties | | | | | | |
|---|---|---|---|---|---|---|---|---|---|---|
| | | | | Peeling test | Ra (μm) | Wa (μm) | Peeling resistance (MPa) | Microstructure observed | | Thickness of reacted layer (μm) |
| | | | | | | | | Surface structure | Sectional structure | |
| Example 2-11 | 3.56 | 91 | 1600° C. 3 hours | not peeled | 4.6 | 2.5 | 34 | 1~3 μm sintered fine particles, not cracked | 1~5 μm pores | 11 |
| Example 2-12 | 3.76 | 96 | 1600° C. 3 hours | not peeled | 5.0 | 2.1 | 36 | 1~3 μm sintered fine particles, not cracked | 1~5 μm pores | 10 |

TABLE 2-7

| | Crystalline phase of film | | Corrosion resistance test | | Heat cycling test | |
|---|---|---|---|---|---|---|
| | Surface of Y₂O₃ film | Reacted layer | Appearance | Peeling test | Appearance | Peeling test |
| Example 2-11 | Cubic-Y₂O₃ | YAG YAM | no change | film not peeled | no change | film not peeled |
| Example 2-12 | Cubic-Y₂O₃ | YAG YAM | no change | film not peeled | no change | film not peeled |

Examples 2-13 to 2-16

Each sample was prepared by spraying under the same condition as in Example 2-1, and subjected to the following thermal treatment, thereby obtaining Examples 2-13 to 2-16. Their physical properties were evaluated in the same manner as in Example 2-1. The density of alumina and the thickness of the sprayed film not thermally treated were the same as those in Example 2-1.

TABLE 2-8

| | Heat treatment condition (° C. × hr) | Film properties | | | | |
|---|---|---|---|---|---|---|
| | | Peeling test | Peeling resistance (MPa) | Ra (μm) | Wa (μm) | Thickness of reacted layer (μm) |
| Example 2-13 | 1400 × 3 | film not peeled | 41 | 4.8 | 2.6 | 2 |
| Example 2-14 | 1450 × 3 | film not peeled | 45 | 4.2 | 2.1 | 3 |
| Example 2-15 | 1500 × 3 | film not peeled | 50 | 4.9 | 2.5 | 5 |
| Example 2-16 | 1550 × 3 | film not peeled | 41 | 4.4 | 2.3 | 7 |

In each of Examples 2-13 and 2-16, the thermally treated film was free from peeling in the peeling test. The surface of the film was constituted by sintered particles of 1 to 3 μm, and free from cracks. There were 1~5 μm voids in a sectional face of the film. The surface and the sectional structure were the same as in Example 2-1.

The surface roughness (Ra) and waveness (Wa) of the film, the thickness of the reaction layer and the peeling resistance are shown in Table 8. When the thermal treating temperature was 1400 to 1500° C. and the holding time was 3 hours, high peeling resistance of not less than 40 MPa was obtained.

(Quantitative Analysis of Impure Metal Elements in the Yttrium Compound Film)

Amounts of impure metal elements in the film in Example 2-1 were quantitatively determined by a glow discharge mass spectrometer (GDMS). Quantitatively determined amounts are shown in Table 2-9.

TABLE 2-9

| Element | Content (ppm) | Element | Content (ppm) |
|---|---|---|---|
| Li | <0.1 | Mn | 0.5 |
| Na | 4 | Fe | 10 |
| Mg | 1 | Co | 1 |
| Al | 18 | Ni | 6 |
| Si | 10 | Cu | 3 |
| K | 0.7 | Zn | 3 |
| Ca | 2.1 | Mo | <0.1 |
| Sc | <0.1 | W | <1 |
| Ti | 0.3 | Rare earth metal (excluding Y) | <2 |
| V | <0.1 | | |
| Cr | 1 | | |

Each of the total content of the alkali metal elements and that of the alkaline earth metal elements is not more than 10 ppm. The total content of the transition metal elements excluding yttrium is not more than 50 ppm.

(Production of Laminate by Co-sintering)

Yttria powder was charged into a mold having a cylinder inner diameter of 60 mm, and molded under a load of 20 MPa. While the yttria molded body was left in the mold, a mixed powder composed of yttria powder and alumina powder (molar ratio 3:5) was charged, the resultant was molded and laminated. Further, alumina powder was charged, molded and laminated. The average particle diameter of the yttria powder used was 2 μm, and that of the alumina powder was 0.6 μm. The thickness of the yttria layer was 1 mm, that of the mixed powder layer was 0.8 mm, and that of the alumina layer was 5 mm. The thus obtained molded body was subjected to hydrostatic press (HIP) under pressure of 2000 MPa, and fired at 1700° C. for 3 hours, thereby obtaining a sintered body.

The thus obtained sintered body was subjected to microstructure observation, identification of crystalline phase, peeling test and measurement of peeling resistance. The observation of the surface and a sectional face revealed through-cracks from the yttria layer to the alumina substrate layer. The observation of the microstructure in the sectional face and identification of the crystalline phase with the X-ray diffraction apparatus revealed the production of a YAG ($Y_3Al_5O_{12}$) phase between the yttria layer and the alumina layer. No peeling was seen in the peeling test. The peeling resistance was 40 MPa.

As having been described herebefore, the present invention can provide the laminate which comprises the alumina substrate and the yttrium compound film formed on the substrate and in which the film is hard to be peeled from the substrate, particularly even if the laminate contacts the corrosive material.

What is claimed is:

1. A laminate comprising an alumina substrate and a yttrium compound film formed on said alumina substrate, wherein a reaction product between said alumina and said yttrium compound exists along an interface between said alumina substrate and said yttrium compound film.

2. A laminate comprising an alumina substrate, a yttrium compound film formed on said substrate, and an intermediate layer along an interface between said alumina substrate and said yttrium compound film, said intermediate layer being made of a reaction product between said alumina and said yttrium compound.

3. The laminate set forth in claim 1, wherein said yttrium compound comprises yttria.

4. The laminate set forth in claim 1, wherein said yttrium compound comprises yttrium fluoride.

5. The laminate set forth in claim 2, wherein said reaction product comprises a crystalline phase composed of a composite oxide of yttria and alumina.

6. The laminate set forth in claim 5, wherein said reaction product comprises a crystalline phase composed of $Y_3Al_5O_{12}$.

7. The laminate set forth in claim 5, wherein said reaction product comprises a crystalline phase composed of $Y_4Al_2O_9$.

8. A laminate comprising a substrate made of alumina, a film of a yttrium compound formed on said substrate, and an intermediate layer present along an interface between said alumina substrate and said yttrium compound film, said intermediate layer comprising a crystalline phase of a composite oxide of alumina and yttria.

9. The laminate set forth in claim 8, wherein said yttrium compound comprises yttria.

10. The laminate set forth in claim 8, wherein said yttrium compound comprises yttrium fluoride.

11. The laminate set forth in claim 8, wherein said reaction product comprises a crystalline phase composed of $Y_3Al_5O_{12}$.

12. The laminate set forth in claim 8, wherein said reaction product comprises a crystalline phase composed of $Y_4Al_2O_9$.

13. The laminate set forth in claim 8, further comprising a microstructure along an interface between said intermediate layer and said substrate, said microstructure comprising fine particles made of a material identical to that of said intermediate layer and voids existing among said fine particles.

14. The laminate set forth in claim 1, wherein a surface of said yttrium compound film has a center-line average surface roughness in a range of 3 to 6 µm and a surface waveness in a range of 1 to 3 µm.

15. The laminate set forth in claim 1, wherein a peeling resistance of the yttrium compound film to the substrate is not less than 15 MPa when measured in a Sebastans test with a diameter of a bonded surface being 5.2 mm.

16. A corrosion-resistant member comprising the laminate set forth in claim 1.

17. A halogen gas plasma-resistant member to be exposed to a halogen gas plasma, comprising the laminate set forth in claim 1 as a substrate.

18. A halogen gas plasma-resistant member to be exposed to a halogen gas plasma, comprising a main body and a corrosion-resistant oxide ceramic film formed at least on a surface of said main body, wherein a peeling resistance of said corrosion-resistant film to said main body is not less than 15 MPa, and wherein a center-line average surface roughness Ra of an underlying face of said corrosion-resistant film is not less than 1.2 mm.

19. A halogen gas plasma-resistant member to be exposed to a halogen gas plasma, comprising a main body and a corrosion-resistant oxide ceramic film formed at least on a surface of said main body, said member further comprising an intermediate layer between said main body and said corrosion-resistant film, said intermediate layer having a coefficient of thermal expansion between that of said member main body and said corrosion-resistant film, wherein a peeling resistance of said corrosion-resistant film to said main body is not less than 15 MPa.

20. A halogen gas plasma-resistant member to be exposed to a halogen gas plasma, comprising a main body and a corrosion-resistant oxide ceramic film formed at least on a surface of said main body, said member further comprising an intermediate layer between said main body and said corrosion-resistant film, said intermediate layer comprising a mixture, a solid solution or a reaction product of a material of said corrosion-resistant film and a material of said main body, wherein a peeling resistance of said corrosion-resistant film to said main body is not less than 15 MPa.

21. The member set forth in claim 18, wherein a relative density of said corrosion-resistant film is not less than 90%.

22. The member set forth in claim 19, wherein a relative density of said corrosion-resistant film is not less than 90%.

23. The member set forth in claim 18, wherein a center-line average surface roughness Ra of said corrosion-resistant film is not more than 1.5 mm.

24. The member set forth in claim 19, wherein a center-line average surface roughness Ra of said corrosion-resistant film is not more than 1.5 mm.

25. The member set forth in claim 20, wherein a center-line average surface roughness Ra of said corrosion-resistant film is not more than 1.5 mm.

26. The member set forth in claim 18, wherein a center-line average surface roughness Ra of said corrosion-resistant film is not less than 1.2 mm.

27. The member set forth in claim 19, wherein a center-line average surface roughness Ra of said corrosion-resistant film is not less than 1.2 mm.

28. The member set forth in claim 20, wherein a center-line average surface roughness Ra of said corrosion-resistant film is not less than 1.2 mm.

29. The member set forth in claim 18, said corrosion-resistant film having a waveness of not less than 1.2 mm.

30. The member set forth in claim 19, said corrosion-resistant film having a waveness of not less than 1.2 mm.

31. The member set forth in claim 20, said corrosion-resistant film having a waveness of not less than 1.2 mm.

32. The member set forth in claim 18, wherein an underlying face of said corrosion-resistant film is porous.

33. The member set forth in claim 19, wherein an underlying face of said corrosion-resistant film is porous.

34. The member set forth in claim 20, wherein an underlying face of said corrosion-resistant film is porous.

35. The member set forth in claim 18, wherein said center-line average surface roughness Ra of said underlying face of the corrosion-resistant film is not more than 2 mm.

36. The member set forth in claim 18, wherein an open porosity of said corrosion-resistant film is not more than 1.5 vol %.

37. The member set forth in claim 18, wherein said corrosion-resistant film is free from cracks having lengths greater than or equal to 3 mm and/or widths greater than or equal to 0.1 mm.

38. The member set forth in claim 19, wherein said corrosion-resistant film is free from cracks having lengths greater than or equal to 3 mm and/or widths greater than or equal to 0.1 mm.

39. The member set forth in claim 20, wherein said corrosion-resistant film is free from cracks having lengths greater than or equal to 3 mm and/or widths greater than or equal to 0.1 mm.

40. The member set forth in claim 19, wherein a thickness of said intermediate layer is not more than 20 mm.

41. The member set forth in claim 20, wherein a concentration ratio of said material of said corrosion-resistant film to said material of said main body in said intermediate layer increases in a direction from a side of said main body to that of said corrosion-resistant film.

42. The member set forth in claim 19, wherein said material of said corrosion-resistant film comprises a yttrium compound.

43. The member set forth in claim 20, wherein said material of said corrosion-resistant film comprises a yttrium compound.

44. The member set forth in claim 19, wherein a concentration of iron atoms contained in said corrosion-resistant film is not more than 30 ppm.

45. The member set forth in claim 20, wherein a concentration of iron atoms contained in said corrosion-resistant film is not more than 30 ppm.

46. The member set forth in claim 19, wherein said material of said main body is alumina.

47. The member set forth in claim 20, wherein said material of said main body is alumina.

48. A method for producing the halogen gas plasma-resistant member set forth in claim 18, comprising the steps of preparing said main body of said member, and forming said corrosion-resistant film on at least a surface of said main body by melting a material of said corrosion-resistant film and spraying said melted material of said corrosion-resistant film onto said surface of said main body to form a spray film on said surface of said main body.

49. The method set forth in claim 48, wherein said material of said corrosion-resistant film is sprayed in a low-pressure state.

50. The method set forth in claim 48, wherein said spray film is thermally treated.

51. The method set forth in claim 48, wherein said material of said corrosion-resistant film comprises a yttrium compound.

52. The method set forth in claim 50, wherein said thermal treatment is effected at a temperature of 1400 to 1600° C.

53. The method set forth in claim 48, wherein pores located at a surface portion of said sprayed film are reduced by depositing said material of said corrosion-resistant film on said spray film according to a chemical gas phase growth method or an electrochemical gas phase growth method.

54. A method for producing the halogen gas plasma-resistant member set forth in claim 18, comprising the steps of preparing said main body of said member, and forming said corrosion-resistant film on at least a surface of said main body according to a chemical gas phase growth method or an electrochemical gas phase growth method.

* * * * *